US006295508B1

United States Patent
Trammell et al.

(10) Patent No.: US 6,295,508 B1
(45) Date of Patent: Sep. 25, 2001

(54) AUTOMATIC POLE-ZERO ADJUSTMENT CIRCUIT FOR AN IONIZING RADIATION SPECTROSCOPY SYSTEM AND METHOD

(75) Inventors: Rex C. Trammell, Andersonville; Russell D. Bingham, Knoxville; Dale A. Gedcke, Oak Ridge, all of TN (US)

(73) Assignee: PerkinElmer Instruments, Inc., Oak Ridge, TN (US)

( * ) Notice: Subject to any disclaimer, the term of this patent is extended or adjusted under 35 U.S.C. 154(b) by 0 days.

(21) Appl. No.: 09/388,094

(22) Filed: Sep. 1, 1999

(51) Int. Cl.[7] ................................................... G06F 17/00
(52) U.S. Cl. ........................ 702/107; 702/66; 702/180; 702/190; 330/5; 250/363.09
(58) Field of Search ................................. 702/107, 22, 27, 702/85, 28, 30–32, 106, 57, 66, 67, 69–71, 73, 74, 78–80, 89, 115, 118, 124–126, 179, 180, 183, 187, 189–191, 193–195, 197, 198, FOR 103, FOR 104, FOR 109, FOR 110, FOR 134, FOR 139, FOR 140, FOR 156, FOR 157, FOR 159–FOR 162, FOR 164, FOR 166, FOR 170, FOR 171; 324/601, 620, 76.14, 76.19; 330/2, 305; 378/91, 53; 250/363.01, 363.05, 363.07–363.09, 370.06, 369, 370.01, 389, 252.1 R, 252.1 A, 390.07, 395, 339.06, 339.07, 339.09, 341.5

(56) References Cited

U.S. PATENT DOCUMENTS

| | | |
|---|---|---|
| 4,866,400 | 9/1989 | Britton, Jr. et al. ................. 330/305 |
| 4,931,653 * | 6/1990 | Hamm et al. ..................... 250/363.01 |
| 5,821,533 * | 10/1998 | Bingham et al. ................. 250/252.1 |
| 5,872,363 | 2/1999 | Bingham et al. ............... 250/363.01 |
| 5,912,825 * | 6/1999 | Bingham .............................. 330/305 |

OTHER PUBLICATIONS

Nowlin, et al.—Elimination of Undesirable Undershoot in Operation and Testing of Nuclear Pulse Amplifiers Rev. Sci. Instr., vol. 36, No.2, Dec. 1965, pp 1830–1839.

* cited by examiner

Primary Examiner—Hal Wachsman
(74) Attorney, Agent, or Firm—Pitts & Brittian, P.C.

(57) ABSTRACT

An automatic pole-zero (APZ) adjustment circuit for an ionizing radiation spectroscopy system. An amplitude histogram of an acquired spectrum is obtained. The shape of a selected peak from the amplitude histogram is analyzed for peak shape distortion indicating the existence of undershoot or overshoot. An analog correction signal generated by a pole-zero adjustment network is added to cancel existing undershoot or overshoot, thereby minimizing distortion of the peak shape. In an alternate embodiment, the correction signal is a digital transformation algorithm applied to a programmable digital shaping filter, thereby digitally minimizing distortion of the peak shape.

28 Claims, 5 Drawing Sheets

AUTOMATIC POLE-ZERO ADJUSTMENT CIRCUIT FOR AN IONIZING RADIATION SPECTROSCOPY SYSTEM AND METHOD

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

1. Field of Invention

This invention relates to an automatic pole-zero adjustment circuit for an ionizing radiation spectroscopy system. Specifically, this invention relates to a circuit for an ionizing radiation spectroscopy system which automatically adjusts the pole-zero based upon peak shape.

2. Description of the Related Art

Radiation detection systems generally employ a radiation detector, such as a germanium or a scintillation detector, to detect radiation from a radiation source, such as alpha or gamma rays. The detection of such energy results in a charge pulse having an amplitude proportional to the energy of the incident radiation. The charge pulse is converted to a voltage pulse by a feedback capacitor incorporated in a preamplifier. A resistor is added in parallel with the capacitor in order to discharge the capacitor in a reasonable amount of time to allow for processing of successive pulses. The parallel combination of the capacitor and the resistor defines the time constant of the exponential decay of the trailing edge of the voltage pulse. The voltage pulse is submitted to a high pass filter to shorten the pulse and improve the signal-to-noise ratio. However, the high pass filter, when supplied with an exponentially decaying signal, produces a filtered signal with an undesirable undershoot, i.e., an excursion below baseline voltage. This is a serious problem because the radiation pulses arrive randomly in time and succeeding pulses can occur during the undershoot of a previous pulse. When this occurs, the measurement of the amplitude of the succeeding pulse is distorted. To compensate, a pole-zero cancellation circuit is used to eliminate the undershoot by diverting a portion of the voltage pulse at the high pass filter input around the filter and combining the diverted portion with the high pass filter output.

Various techniques have been used to implement the pole-zero cancellation method. This was originally done manually. (See Nowlin et al., "Elimination of Undesirable Undershoot in the Operation and Testing of Nuclear Pulse Amplifiers", Rev. Sci. Instr., vol.36, no. 2, December 1965, pp 830–839). However, untrained non-technical personnel, such as at medical clinics, encountered difficulty when compelled to adjust the shunting resistance or other components to null the undershoot and avoid overshoot. Accordingly, an automatic approach was proposed as in U.S. Pat. No. 4,866,400 (the '400 patent) to Britton, Jr. et al., issued on Sep. 12, 1989, entitled Automatic Pole-Zero Adjustment Circuit for an Ionizing Radiation Spectroscopy System, fully incorporated herein by reference. However, even using the automated approach, improvement of the adjustment accuracy is desirable by eliminating errors such as glitches, pedestals, offsets, and temperature drift in the analog automatic pole-zero (APZ) sampling circuit.

U.S. Pat. No. 5,872,363 issued to Bingham et al., discloses an automatic pole-zero adjustment circuit for an ionizing radiation spectroscopy system which directly measures the over/undershoot of the digital filtered signal. A correction signal is calculated based on the measured over/undershoot value and that signal is applied to a pole-zero adjustment network. Accordingly, Bingham et al., make automatic pole-zero adjustments based on intermediate outputs of the ionizing radiation spectroscopy system.

By making adjustments based upon the final output of the ionizing radiation spectroscopy system, a more accurate and stable solution for making automatic pole-zero adjustments is achieved over the prior art systems.

It is therefore an object of this invention to provide an improved automatic pole-zero adjustment circuit.

Yet another object of this invention is to provide such an improved automatic pole-zero adjustment circuit which is more accurate.

A still further object of this invention is to provide an improved automatic pole-zero adjustment circuit which is more flexible in the selection of sampling and correction circuits.

BRIEF SUMMARY OF THE INVENTION

An automatic pole-zero (APZ) adjustment circuit for an ionizing radiation spectroscopy system is provided. The detected radiation emissions are fed into a preamplifier with a conventional parallel RC feedback circuit and passed to a high pass filter. The high pass filter improves the signal-to-noise ratio but the exponentially decaying output of the high pass filter results in undershoot. Undershoot is canceled by adding a correction signal generated by a pole-zero adjustment network. The correction signal is selected to algebraically cancel the undershoot when summed with the output signal of the high pass filter.

The high pass filter output is delivered to a digital conversion circuit where it is amplified by an amplifier which includes a feedback resistor. A sampling analog-to-digital converter (ADC) samples and converts the amplified analog signal to a digital signal. The digital signal passes through a digital shaping filter that improves the precision of the energy measurement by removing higher frequencies which improves the signal-to-noise ratio and minimizes the effects due to variable rise times and base line errors. The digital shaping filter results in a pulse which has a longer rise time but still represents the energy of the detected emission.

A pulse amplitude sampling circuit samples the peak amplitude of each pulse output from the digital shaping filter. A histogram containing the number of pulses at each different voltage level is recorded by an amplitude histogram circuit. The histogram, which displays one or more peaks identifying the nature of the radiant emission detected, may be viewed in a display.

An automatic pole-zero (APZ) sampling circuit takes the output of the amplitude histogram circuit and uses an analysis of the peak shape of the histogram to drive a control circuit which, in turn, adjusts the pole-zero adjustment network to produce the correction signal. The shape of the histogram peak indicates whether the pole-zero adjustment is correct. A balanced pole-zero network results in a peak having minimum distortion as evidenced by a peak having a minimum width and a near Gaussian distribution, while an unbalanced pole-zero network results in an asymmetric bell-shaped distribution showing low side distortion (undershoot) or high side distortion (overshoot).

The increased accuracy and flexibility of the system are more clearly understandable through a discussion of the operation of the automatic pole-zero sampling circuit and control circuit. A direct way of pole-zero adjustment is to examine the shape of the spectral peaks. If the peak shape shows high side distortion, then the circuit is over-compensated. If the peak shape shows count rate dependent low side distortion, then the circuit is under-compensated. If necessary, adjustments are made until the peak width is minimized.

In an alternate embodiment of the automatic pole-zero, the high pass filter, the pole-zero adjustment network, and the amplifier with feedback resistance are eliminated and the compensation accomplished directly in a programmable digital shaping filter which transforms the exponential pulse shape into the desired pulse shape thus eliminating the undershoot/overshoot.

BRIEF DESCRIPTION OF THE SEVERAL VIEWS OF THE DRAWINGS

The above-mentioned features of the invention will become more clearly understood from the following detailed description of the invention read together with the drawings in which.

DETAILED DESCRIPTION OF THE INVENTION

Figure 1:
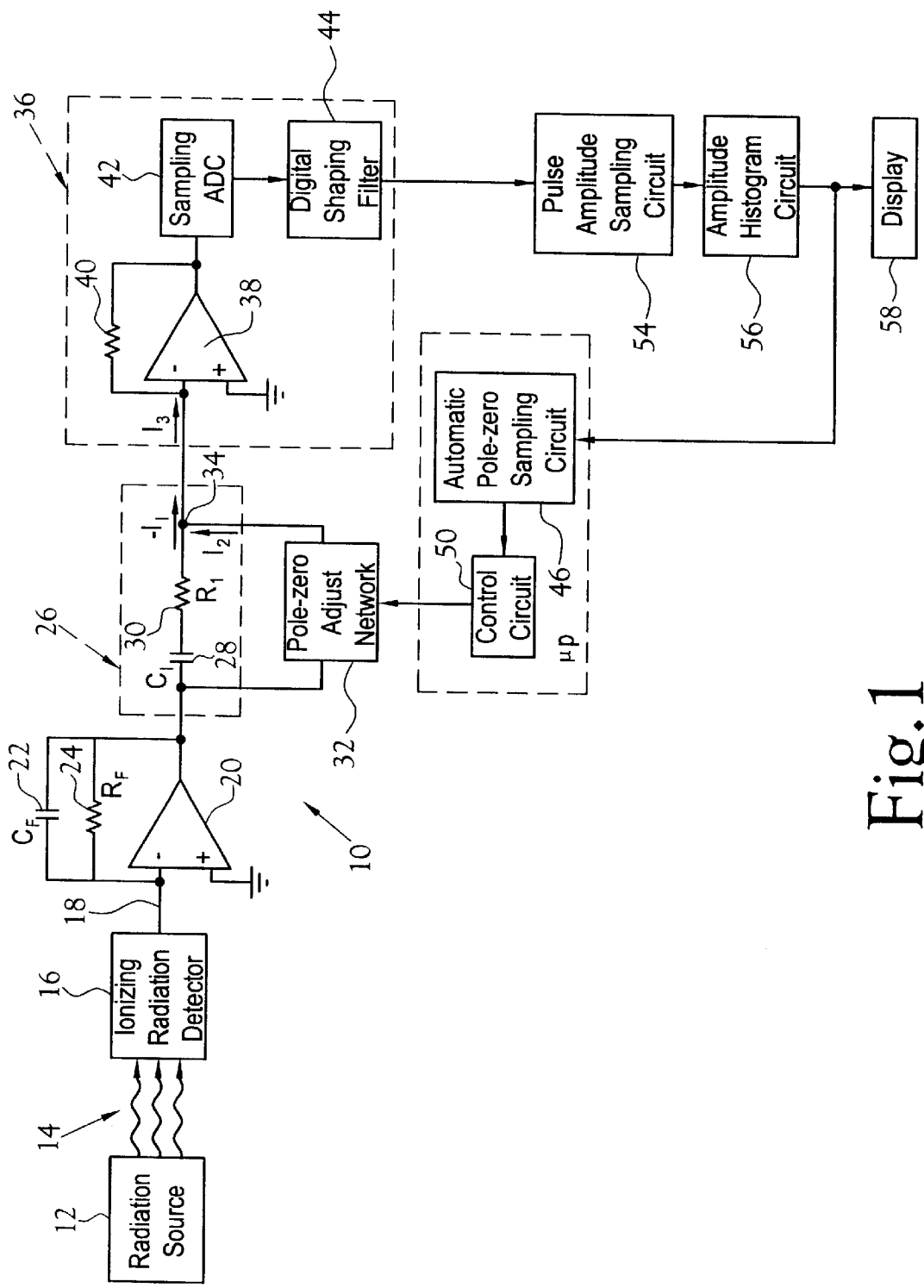
FIG. 1 is a schematic block diagram of an automatic pole-zero adjustment circuit for an ionizing radiation spectroscopy system according to this invention.

There is shown in FIG. 1 an automatic pole-zero (APZ) adjustment circuit 10 according to this invention including a source 12 of radiation such as alpha or gamma rays. Each quantum of radiation 14 is sensed by an ionizing radiation detector 16 and converted to a charge, producing a signal on line 18 that is submitted to a preamplifier 20. The preamplifier 20 has a feedback network including a capacitor, $C_F$, 22 and a resistor, $R_F$, 24 connected in parallel. The output from the preamplifier 20 is delivered to a high pass filter 26 which includes a capacitor, $C_I$, 28 and a resistor, $R_I$, 30 connected in series. The high pass filter 26 provides an exponential decay for a step pulse; however, because the voltage supplied to the input of the high pass filter 26 is a decaying voltage, the exponential decaying output of the high pass filter 26 tends to be a decaying waveform with undershoot.

Figure 7:
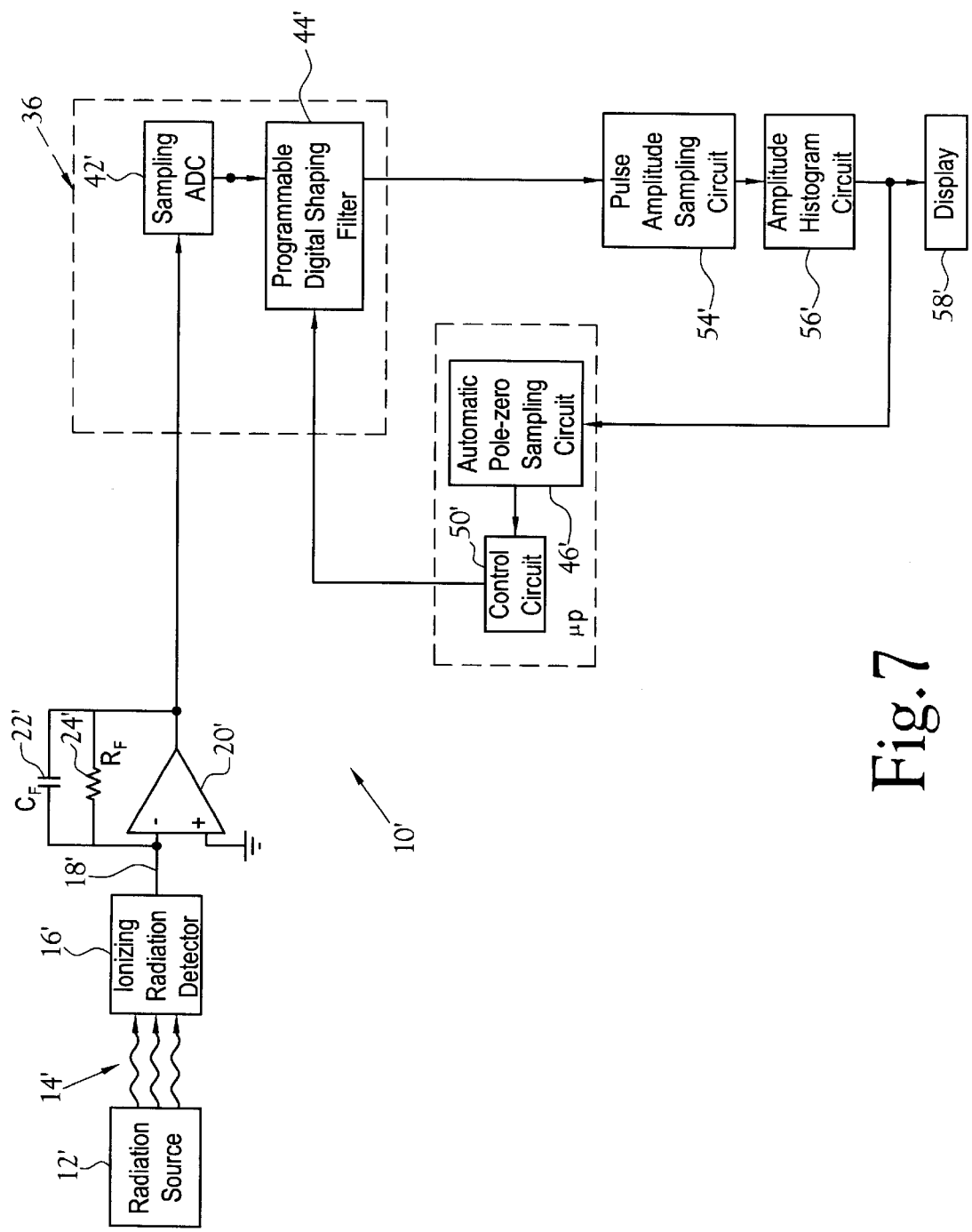
FIG. 7 is a schematic block diagram of an alternate embodiment of the automatic pole-zero adjustment circuit according to this invention.

While not desirable, undershoot is a consequence of the high pass filter 26. The high pass filter 26 is necessary to improve the signal-to-noise ratio by eliminating low frequencies, to make room for analyzing succeeding pulses by bringing each pulse to baseline as quickly as possible and avoiding interference with the next pulse, and to minimize the DC offset resulting from pulse pile-up at high repetition rates while allowing greater amplification of the signal. A pole-zero adjustment network 32 introduces a correction signal, $I_2$, selected to algebraically cancel the undershoot when summed with the output signal, $I_1$, of the high pass filter 26 at node 34. One skilled in the art will recognize that the pole-zero adjustment network 32 can be implemented using various methods, for example, a simple adjustable resistor, such as a potentiometer, driven by a stepping motor or a more sophisticated system such as that shown in U.S. Pat. No. 4,866,400 (the '400 patent) patent. The preferred embodiment of the pole-zero adjustment network 32 includes a number of amplifiers and a multiplying digital-to-analog converter as shown in FIG. 7 of the '400 patent.

The high pass filter output is delivered to a digital conversion circuit 36 where it is amplified by an amplifier 38 which includes a feedback resistor 40. A sampling analog-to-digital converter (ADC) 42 samples and converts the amplified analog signal to a digital signal. In the preferred embodiment, the ADC 42 samples the signal approximately every 50 nanoseconds. The digital signal passes through a digital shaping filter 44 that improves the precision of the energy measurement by improving the signal-to-noise ratio and minimizing the effects due to variable rise times and base line errors. The digital shaping filter 44 results in a pulse which has a longer rise time but still represents the energy of the detected emission. In the illustrated embodiment, the digital shaping filter 44 is a low pass filter.

A pulse amplitude sampling circuit 54 samples the peak amplitude of each pulse output from the digital shaping filter 44. A histogram containing the number of pulses at each different voltage level is recorded by an amplitude histogram circuit 56. The histogram, which displays one or more peaks identifying the nature of the radiant emission detected, may be viewed in a display 58.

An automatic pole-zero (APZ) sampling circuit 46 takes the output of the amplitude histogram circuit 56 and uses an analysis of the peak shape of the histogram drive a control circuit 50 which, in turn, calculates a correction signal which is applied through the pole-zero adjustment network 32. In the illustrated embodiment, the APZ sampling circuit 46 and the control circuit 50 are implemented with a microprocessor, such as an Intel 1386, in combination with a digital signal processor, such as a Motorola DSP56002. Using information from the APZ sampling circuit 46, the control circuit 50 then generates a digital representation of the desired control signal which is converted to an analog control signal by a digital-to-analog converter in the pole adjustment network 32.

Figure 2:
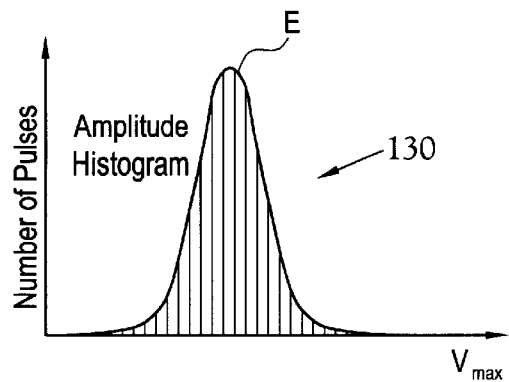
FIG. 2 depicts an amplitude histogram recorded by the present invention of FIG. 1 correctly compensated such that it evidences no undershoot or overshoot.
Figure 3:
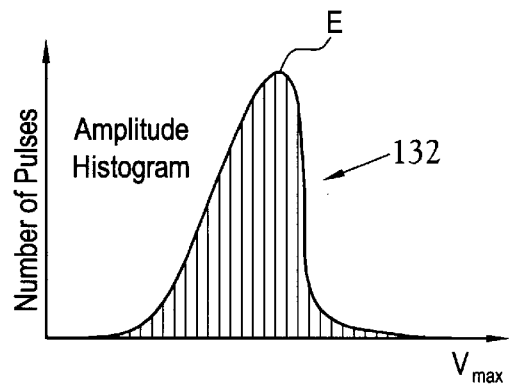
FIG. 3 depicts an amplitude histogram recorded by the present invention of FIG. 1 evidencing undershoot.
Figure 4:
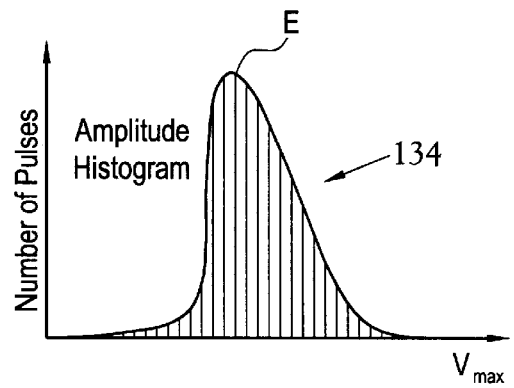
FIG. 4 depicts an amplitude histogram recorded by the present invention of FIG. 1 evidencing overshoot.

FIG. 2 shows a histogram in which the number of pulses is charted against the voltage of the pulses as generated by the amplitude histogram circuit 56. The peak pulse voltage, E, is used to identify the particular radiant emission and the corresponding emission source. One skilled in the art will recognize that while FIG. 2 illustrates only a single peak of the histogram 130, a typical spectrum would include a number of such peaks to identify a particular radiation source. The histogram 130 of FIG. 2 has minimum distribution as evidenced by the minimum width and near Gaussian distribution which indicates that the over/undershoot has been properly canceled. However, when undershoot is present, the amplitude sampled by the pulse amplitude sampling circuit 54 is reduced by the magnitude of the undershoot. FIG. 3 illustrates the unbalanced histogram 132 of a spectral peak having low side distortion resulting from the recording of a disproportionate number of low amplitude pulses caused by undershoot. Conversely, when overshoot is present, pulses having amplitudes increased by the magnitude of the overshoot are sampled by the pulse amplitude sampling circuit 54 resulting in the histogram 134 of FIG. 4 showing high side distortion.

Figure 5:
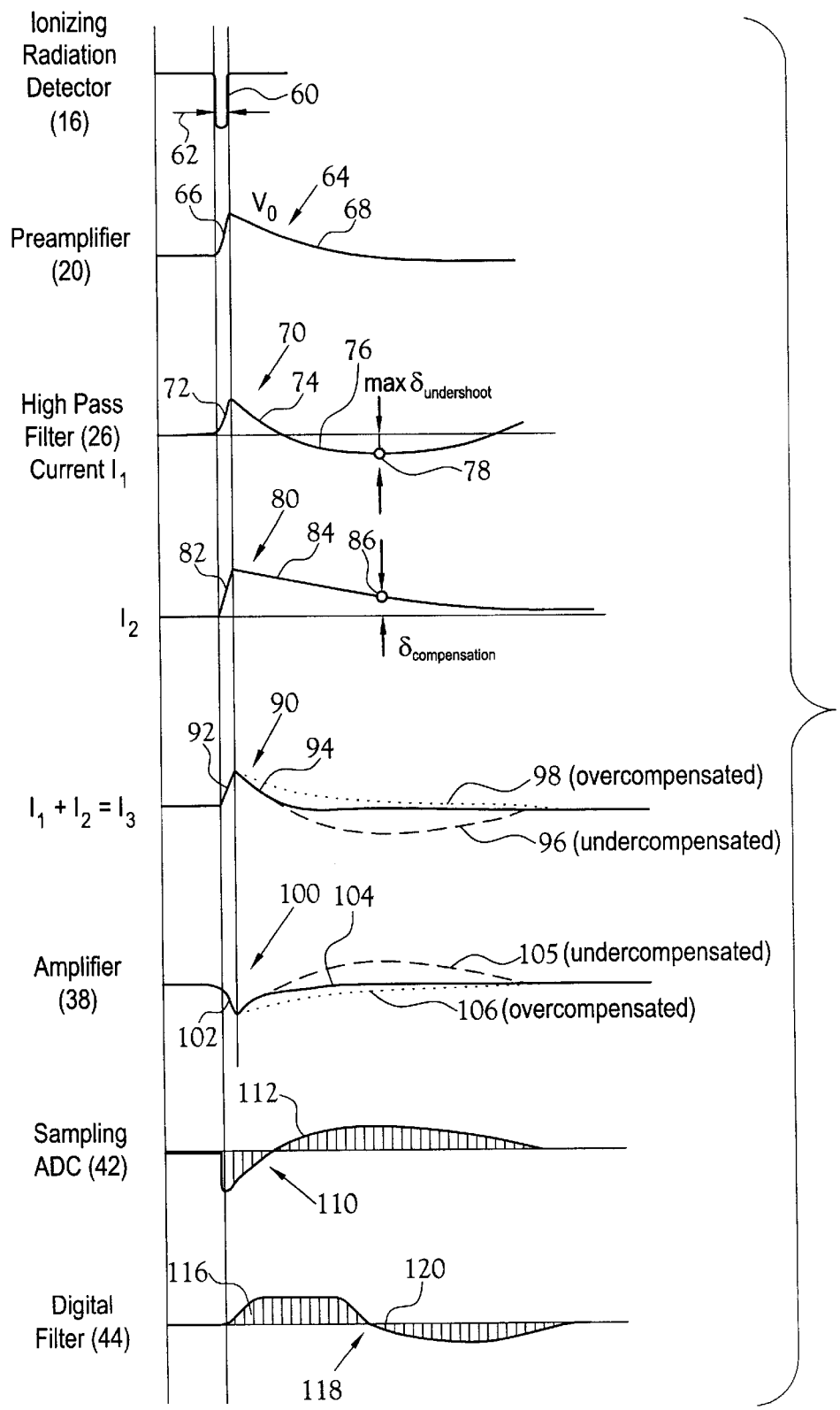
FIG. 5 depicts a series of waveforms which occur in the circuit of FIG. 1.

To aid in understanding, FIG. 5 illustrates the waveforms present at various points in the APZ adjustment circuit 10. At the output of ionizing radiation detector 16, the negative-going signal pulse 60 represents the charge generated by the incident radiation. The duration of this pulse, indicated at 62 and exaggerated for illustrative clarity, is extremely short, typically 0.1 to 0.6 microseconds. Upon passing through the preamplifier 20, the detected pulse 60 is converted to an amplified pulse 64. The amplified pulse 64 has the same duration from the onset at the leading edge 66 to a peak voltage, $V_0$, followed by an exponential voltage decay 68 defined by the time constant of the preamplifier $\tau_{preamp} = R_F C_F$. At the output of the high pass filter 26, the filtered signal pulse 70 has a fast rise time from the leading edge 72 to a peak current, $I_0$. The decay along the trailing edge 74 is expressed as $$I_0 \left[ \frac{\tau_{preamp} e^{-t/R_1 C_1} - R_1 C_1 e^{-t/\tau_{preamp}}}{\tau_{preamp} - R_1 C_1} \right] \quad (1)$$

The desired time constant is $\tau_{desired} = R_1 C_1$. The trailing edge 74 shows the undershoot 76 having a maximum $\delta_{undershoot}$ at a point 78.

The correction signal, $I_2$, measured at node 34 appears in the form of pulse 80 having a fast rise time along the leading edge 82 until reaching a peak current, $KI_0$, where $$K = \frac{\tau_{desired}}{\tau_{preamp} - \tau_{desired}} \quad (2)$$

Ideally, the exponential decay of the correction signal trailing edge 84 is calculated as $$KI_0 e^{-t/R_f C_f} \quad (3)$$

such that the value at a point 86 has the same magnitude as the point of maximum undershoot 78 in the high pass filter output signal 70.

Thus, when signals $I_1$ and $I_2$ are combined, the undershoot in the resulting compensated signal, $I_3$, 90 is canceled and the leading edge 92 shares the same rapid rise time as the previous pulses. The exponential decay of the compensated signal 90 is defined as $$K_2 I_0 e^{-t/R_1 C_1} \quad (4)$$

where $K_2 = 1 + K$. Accordingly, the compensated signal trailing edge 94 quickly declines to zero without undershooting the zero base line (i.e., $\delta_{compensation} = \delta_{undershoot}$). Precise compensation is critical. Undercompensation results in a portion of the undershoot still being present as indicated by the dashed line 96 and overcompensation results in an undesirably long return to baseline (overshoot) as indicated by the dotted path 98. The amplifier 38 inverts the compensated pulse 90 as illustrated by the amplified pulse 100 having a leading edge 102 and a trailing edge 104 corresponding to the those of the compensated pulse 90. The results of undercompensation 105 and overcompensation 106 are similarly illustrated.

The final two illustrated pulses are shown in an uncompensated state. The digitized output pulse 110 of the sampling ADC 42 is illustrated showing the effects of undershoot 112. The digitally filtered pulse 118 shows a slower rise time along the leading edge 116 resulting from the enhancement of the signal-to-noise ratio by the removal of the higher frequencies. Further, the digitally filtered pulse 118 becomes less sharp and more rounded and shows an undershoot 120. It is the digitally filtered pulse 118 which is sampled by the pulse amplitude sampling circuit 54 for sorting by the amplitude histogram circuit 56.

The increased accuracy and flexibility of the system are more clearly apparent when considering the operation of automatic pole-zero sampling circuit 46 and control circuit 50. A direct way of pole-zero adjustment is to examine the shape of the spectral peaks. If the peak shape shows high side distortion, then the circuit is over-compensated. If the peak shape shows low side distortion, then it is necessary to consider whether the distortion is the result of charge trapping in the detector which should not be corrected or the result of undershoot which should.

One skilled in the art will recognize that several differing methods may be used to correct the peak shape without compensating for charge trapping. A first such method involves measuring the width of a peak at at least one predetermined fractions of the full height of the peak and making adjustments until minimum values for each are obtained. A second method involves obtaining a reference peak at a low count rate, where pole-zero misadjustment has little effect, and ignoring the low side peak shape distortion. Adjustments are then made until the centroid of a peak obtained at a high count rate is as close as possible to the centroid of the reference peak. A similar method involves obtaining a reference peak at a low count rate and making adjustments until the width of a peak obtained at a high count rate is as close as possible to the width of the reference peak. These two related methods can be combined to further improve the pole-zero adjustment. Yet another method involves measuring the width between the centroid and the high side (high side width) at at least one predetermined fraction of the full height of the peak and making adjustments by increasing the compensation until the high side width increases and then reducing the compensation until the high side width does not change. In the preferred embodiment, the automatic pole-zero sampling circuit 46 and the control circuit 50 are implemented in a single microprocessor and programmed in accordance with the flow chart of FIG. 6.

Figure 6:
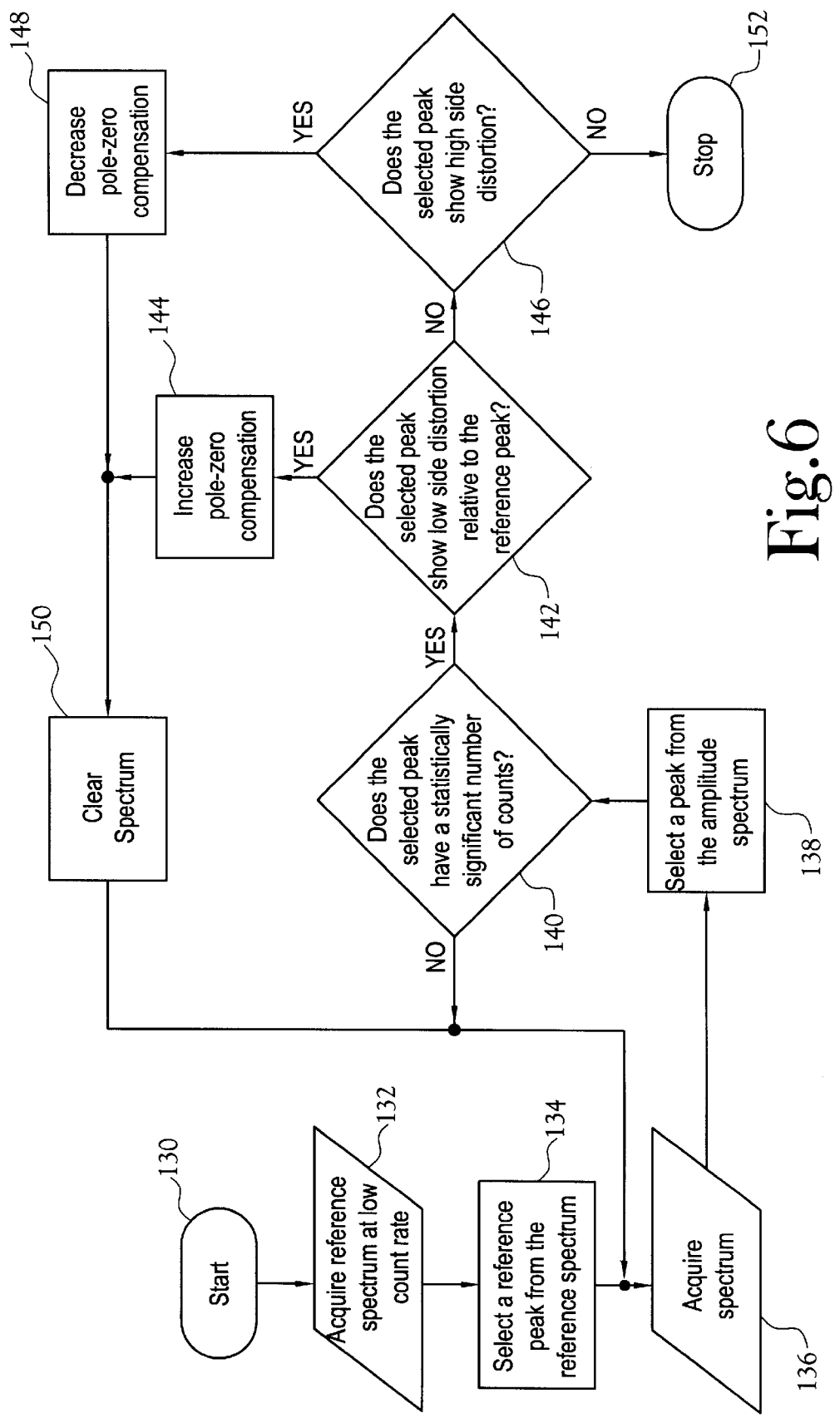
FIG. 6 is a flow chart of the preferred embodiment of the software which can be used to operate the automatic pole-zero sampling circuit and control circuit of FIG. 1 implemented in a microprocessor.

FIG. 6 is a flow chart of the preferred embodiment of a method of correction implemented by the automatic pole-zero (APZ) adjustment circuit 10. Operation is begun by either manual or software-actuated initiation of the start automatic pole-zero adjustment sequence in step 130. A start command is desirable because automatic pole-zero adjustment may be necessary only at infrequent intervals. A reference spectrum is acquired in step 132 and a reference peak is selected from the reference spectrum in step 134. The iterative process begins by acquiring a spectrum in step 136. A peak from the spectrum is selected in step 138. Step 140 requires a decision as to whether the measured spectrum includes a statistically significant number of counts so as to provide useful information for making a pole-zero adjustment. If the number of counts is not statistically significant, the process repeats with additional counts being added from a new spectrum acquisition in step 136. For a spectrum having a statistically significant number of counts, the shape of a histogram peak is analyzed. In step 142, a determination is made as to whether the peak shape evidences low side distortion relative to the reference peak. If so, the pole-zero compensation is increased in step 144, the spectrum is cleared in step 150, and a new spectrum is acquired in step 136. If no low side distortion relative to the reference peak is present, a determination is made as to whether the peak shape evidences high side distortion in step 146. If so, the pole-zero compensation is decreased in step 148, the spectrum is cleared in step 150, and a new spectrum is acquired in step 136. Finally, if no high side distortion is present, indicating that the spectral peak width has been minimized, then the automatic pole-zero adjustment is complete and the operation is terminated in step 152. One skilled in the art will recognize that faster convergence is obtained by varying the step size of a compensation adjustment based upon the direction and size of previous adjustments.

FIG. 7 illustrates an alternate embodiment of the automatic pole-zero (APZ) adjustment circuit 10'. In this embodiment, the high pass filter 26, the pole-zero adjustment network 32, and the amplifier 38 with feedback resistance 40 of FIG. 1 are eliminated and the compensation accomplished directly in a programmable digital shaping filter 44' which transforms the exponential pulse shape into the desired pulse shape thus eliminating the over/undershoot.

The pulse at the output of a sampling ADC 42' has an exponential decay whose Z-transform is described by $$\frac{1}{1 - e^{t'/\tau_{preamplifier}} Z^{-1}} \quad (5)$$

where t' is the sampling period of the ADC 42'. Programmable digital shaping filter 44' transforms the pulse from ADC 42' into the desired output pulse shape by applying a digital filter of the form $$H(Z)(1 - e^{t'/\tau_{adj}} Z^{-1}) \quad (6)$$

where H(z) is the Z-transform of the desired output pulse shape. The over/undershoot compensation is accomplished by adjusting $\tau_{adj}$ to match $\tau_{preamp}$. Accordingly, the spectrum peak shape distortion is minimized when the time constants of the digital transformation algorithm Equation 6 match.

It will be obvious to those skilled in the art that a variety of specific criteria for detecting convergence and stopping the adjustment can be selected according to this invention.

Although specific features of the invention are shown in some drawings and not others, this is for convenience only as each feature may be combined with any or all of the other features in accordance with the invention.

While a preferred embodiment has been shown and described, it will be understood that it is not intended to limit the disclosure, but rather it is intended to cover all modifications and alternate methods falling within the spirit and the scope of the invention as defined in the appended claims.

Having thus described the aforementioned invention, we claim:

1. An automatic pole-zero adjustment circuit for an ionizing radiation spectroscopy system, said automatic pole-zero adjustment circuit comprising:
   a high pass filter responsive to random analog pulses producing an output;
   an analog-to-digital converter in electrical communication with said high pass filter, said analog-to-digital converter converting said high pass filter output to digital pulses;
   a digital shaping filter in electrical communication with said analog-to-digital converter;
   an amplitude histogram circuit in electrical communication with said digital shaping filter, said amplitude histogram circuit sorting and counting said digital pulses by amplitude and producing a histogram of the number of said digital pulses charted against the voltage of said digital pulses, said amplitude histogram containing at least one peak;
   a processing device in electrical communication with said amplitude histogram circuit, said processing device for selecting one of said at least one peak from said amplitude histogram as a selected peak and measuring the shape of said selected peak;
   a control circuit in electrical communication with said processing device for generating a control signal calculated to minimize distortion in said selected peak shape; and
   a pole-zero adjustment network in electrical communication with said control circuit and said high pass filter, said pole-zero adjustment network generating an analog control signal corresponding to said control signal and applying said analog control signal to said high pass filter output.

2. The automatic pole-zero adjustment circuit of claim 1 wherein said control circuit is digitally programmable.

3. The automatic pole-zero adjustment circuit of claim 1 wherein said processing device determines whether a statistically significant number of counts exist in said selected peak.

4. The automatic pole-zero adjustment circuit of claim 1 wherein said processing device stops adjusting said pole-zero adjustment network after said selected peak shows minimum distortion.

5. The automatic pole-zero adjustment circuit of claim 1 further comprising an amplifier in electrical communication between said high pass filter and said analog-to-digital converter.

6. An automatic pole-zero adjustment circuit for an ionizing radiation spectroscopy system, said automatic pole-zero adjustment circuit comprising:
   an analog-to-digital converter responsive to random analog pulses, said analog-to-digital converter converting said random analog pulses to digital pulses;
   a programmable digital shaping filter in electrical communication with said analog-to-digital converter;
   an amplitude histogram circuit in electrical communication with said programmable digital shaping filter, said amplitude histogram circuit sorting and counting said digital pulses by amplitude and producing a histogram of the number of said digital pulses charted against the voltage of said digital pulses, said histogram containing at least one peak;
   a processing device in electrical communication with said amplitude histogram circuit, said processing device for selecting one of said at least one peak as a selected peak and measuring a shape of said selected peak; and
   a control circuit in electrical communication with said processing device and said programmable digital shaping filter, said control circuit controlling said programmable digital shaping filter to produce a desired shape in said digital pulses.

7. The automatic pole-zero adjustment circuit of claim 6 wherein said control circuit is digitally programmable.

8. The automatic pole-zero adjustment circuit of claim 6 wherein said processing device determines whether a statistically significant number of counts exist in said selected peak.

9. The automatic pole-zero adjustment circuit of claim 6 wherein said processing device stops adjusting a pole-zero adjustment network after said selected peak shows minimum distortion.

10. A method of automatically adjusting a pole-zero adjustment circuit of an ionizing radiation spectroscopy system to achieve a peak shape having a minimum distortion, said method comprising the steps of:
(a) detecting radiation from a radiation source using a radiation detector and producing a random sequence of analog pulses representing said detected radiation;
(b) processing said random sequence of analog pulses by passing said random sequence of analog pulses through a preamplifier and producing a sequence of preamplified analog pulses having a characteristic decay time constant;
(c) processing said sequence of preamplified analog pulses through a high pass filter incorporating a pole-zero cancellation network to produce a sequence of filtered pulses;
(d) digitizing said sequence of filtered pulses to produce a sequence of digitized pulses;
(e) histogramming said sequence of digitized pulses to produce a spectrum characteristic of said radiation source;
(f) selecting at least one peak from said spectrum suitable for determining the accuracy of an adjustment made by said pole-zero adjustment network;
(g) measuring a distortion in said at least one peak to determine a correction calculated to minimize said distortion;
(h) applying said correction to said pole-zero cancellation network; and
(i) repeating said step of detecting radiation from a radiation source using a radiation detector and producing a random sequence of analog pulses representing said detected radiation through said step of applying said correction to said pole-zero cancellation network until said distortion is minimized.

11. A method of automatically adjusting of an ionizing radiation spectroscopy system to achieve a peak shape having a minimum distortion, said method comprising the steps of:
(a) detecting radiation from a radiation source using a radiation detector and producing a random sequence of analog pulses representing said detected radiation;
(b) processing said random sequence of analog pulses by passing said random sequence of analog pulses through a preamplifier and producing a sequence of preamplified analog pulses having a characteristic decay time constant;
(c) digitizing said sequence of preamplified analog pulses to produce a sequence of digitized pulses;
(d) processing said sequence of digital pulses through a digital filter to produce a sequence of filtered digital pulses;
(e) histogramming said sequence of filtered digital pulses to produce a spectrum characteristic of said radiation source;
(f) selecting at least one peak from said spectrum suitable for determining the accuracy of an adjustment made by said digital filter;
(g) measuring a distortion in said at least one peak to determine a correction calculated to minimize said distortion;
(h) applying said correction to said digital filter; and
(i) repeating said step of detecting radiation from a radiation source using a radiation detector and producing a random sequence of analog pulses representing said detected radiation through said step of applying said correction to said digital filter until said distortion is minimized.

12. An automatic pole-zero adjustment circuit for an ionizing radiation spectroscopy system comprising:
a high pass filter means responsive to random analog pulses passing through the system;
a pole-zero adjustment means for algebraically adding a correction signal to an output of said high pass filter means to compensate for undershoot/overshoot of said random analog pulses;
a digital conversion means responsive to said high pass filter means, said digital conversion means for converting said random analog pulses to digital pulses;
an amplitude histogramming means for sorting and counting said digital pulses by amplitude and producing a spectrum characteristic of a radiation source;
a peak shape measurement means for selecting a peak from said spectrum, accumulating a statistically significant number of counts in said peak, and measuring the shape of said peak; and
a control means responsive to said peak shape measurement means, said control means for driving said pole-zero adjustment means to produce a final peak shape with minimum distortion from incorrect pole-zero adjustment.

13. The automatic pole-zero adjustment circuit for an ionizing radiation spectroscopy system of claim 12 wherein said digital conversion means includes an amplifier circuit.

14. The automatic pole-zero adjustment circuit for an ionizing radiation spectroscopy system of claim 12 wherein said digital conversion means includes a sampling analog-to-digital converter.

15. The automatic pole-zero adjustment circuit for an ionizing radiation spectroscopy system of claim 12 wherein said peak shape measurement means is programmable.

16. The automatic pole-zero adjustment circuit for an ionizing radiation spectroscopy system of claim 12 wherein said control means is programmable.

17. An automatic pole-zero adjustment circuit for an ionizing radiation spectroscopy system, said automatic pole-zero adjustment circuit comprising:
a digital conversion means responsive to random analog pulses, said digital conversion means for converting said random analog pulses to digital pulses;
a peak shape measurement means for selecting a peak from said digital pulses, accumulating a statistically significant number of counts in said peak, and measuring the shape of said peak;
a programmable digital shaping filter means for producing a desired shape in said digital pulses and to compensate for undershoot/overshoot at the output of said digital conversion means;
an amplitude histogramming means for sorting and counting said digital pulses by amplitude and producing a spectrum characteristic of a radiation source; and
a digital control means responsive to said peak shape measurement means, said digital control means for updating said programmable digital shaping filter means to produce a final peak shape with minimum distortion.

18. The automatic pole-zero adjustment circuit of claim 17 wherein said digital conversion means includes a sampling analog-to-digital converter.

19. The automatic pole-zero adjustment circuit of claim 17 wherein said peak shape measurement means is programmable.

20. The automatic pole-zero adjustment circuit of claim 17 wherein said digital control means is programmable.

21. A method of automatically adjusting a pole-zero adjustment circuit of an ionizing radiation spectroscopy system to achieve a peak shape having a minimum distortion, said method comprising the steps of:
   (a) detecting radiation from a radiation source using a radiation detector and producing a random sequence of analog pulses representing said detected radiation;
   (b) processing said random sequence of analog pulses by passing said random sequence of analog pulses through a preamplifier and producing a sequence of preamplified analog pulses having a characteristic decay time constant;
   (c) processing said sequence of preamplified analog pulses through a high pass filter incorporating a pole-zero cancellation network to produce a sequence of filtered pulses;
   (d) digitizing said sequence of filtered pulses to produce a sequence of digitized pulses;
   (e) histogramming said sequence of digitized pulses to produce a spectrum characteristic of said radiation source;
   (f) selecting at least one peak from said spectrum suitable for determining the accuracy of an adjustment made by said pole-zero adjustment network;
   (g) measuring a distortion in said at least one peak to determine a correction calculated to minimize said distortion, said step of measuring a distortion in said at least one peak to determine a correction calculated to minimize said distortion including the step of:
      (1) measuring a width at at least one predetermined fraction of a full height of said at least one peak and calculating said correction;
   wherein when each said width at at least one predetermined fraction of a full height is minimized it is determined that said peak shape has a minimum said distortion;
   (h) applying said correction to said pole-zero cancellation network; and
   (i) repeating said step of detecting radiation from a radiation source using a radiation detector and producing a random sequence of analog pulses representing said detected radiation through said step of applying said correction to said pole-zero cancellation network until said distortion is minimized.

22. A method of automatically adjusting a pole-zero adjustment circuit of an ionizing radiation spectroscopy system to achieve a peak shape having a minimum distortion, said method comprising the steps of:
   (a) detecting radiation from a radiation source using a radiation detector and producing a random sequence of analog pulses representing said detected radiation;
   (b) processing said random sequence of analog pulses by passing said random sequence of analog pulses through a preamplifier and producing a sequence of preamplified analog pulses having a characteristic decay time constant;
   (c) processing said sequence of preamplified analog pulses through a high pass filter incorporating a pole-zero cancellation network to produce a sequence of filtered pulses;
   (d) digitizing said sequence of filtered pulses to produce a sequence of digitized pulses;
   (e) histogramming said sequence of digitized pulses to produce a spectrum characteristic of said radiation source;
   (f) selecting at least one peak from said spectrum suitable for determining the accuracy of an adjustment made by said pole-zero adjustment network;
   (g) measuring a distortion in said at least one peak to determine a correction calculated to minimize said distortion, said step of measuring a distortion in said at least one peak to determine a correction calculated to minimize said distortion including the steps of:
      (1) measuring a centroid of a reference peak from an amplitude histogram obtained at a low count rate;
      (2) measuring a centroid of a peak from an amplitude histogram obtained at a high count rate; and
      (3) calculating said correction;
   wherein when said high count rate peak centroid approximately coincides with said reference peak centroid it is determined that said peak shape has a minimum said distortion;
   (h) applying said correction to said pole-zero cancellation network; and
   (i) repeating said step of detecting radiation from a radiation source using a radiation detector and producing a random sequence of analog pulses representing said detected radiation through said step of applying said correction to said pole-zero cancellation network until said distortion is minimized.

23. A method of automatically adjusting a pole-zero adjustment circuit of an ionizing radiation spectroscopy system to achieve a peak shape having a minimum distortion, said method comprising the steps of:
   (a) detecting radiation from a radiation source using a radiation detector and producing a random sequence of analog pulses representing said detected radiation;
   (b) processing said random sequence of analog pulses by passing said random sequence of analog pulses through a preamplifier and producing a sequence of preamplified analog pulses having a characteristic decay time constant;
   (c) processing said sequence of preamplified analog pulses through a high pass filter incorporating a pole-zero cancellation network to produce a sequence of filtered pulses;
   (d) digitizing said sequence of filtered pulses to produce a sequence of digitized pulses;
   (e) histogramming said sequence of digitized pulses to produce a spectrum characteristic of said radiation source;
   (f) selecting at least one peak from said spectrum suitable for determining the accuracy of an adjustment made by said pole-zero adjustment network;
   (g) measuring a distortion in said at least one peak to determine a correction calculated to minimize said distortion, said step of measuring a distortion in said at least one peak to determine a correction calculated to minimize said distortion including the steps of:
      (1) measuring a width of a reference peak from an amplitude histogram obtained at a low count rate; and
      (2) measuring a width of a peak from an amplitude histogram obtained at a high count rate and calculating said correction;

wherein when said high count rate peak width approximately equals said reference peak width it is determined that said peak shape has a minimum said distortion;

(h) applying said correction to said pole-zero cancellation network; and (i) repeating said step of detecting radiation from a radiation source using a radiation detector and producing a random sequence of analog pulses representing said detected radiation through said step of applying said correction to said pole-zero cancellation network until said distortion is minimized.

24. A method of automatically adjusting a pole-zero adjustment circuit of an ionizing radiation spectroscopy system to achieve a peak shape having a minimum distortion, said method comprising the steps of:

(a) detecting radiation from a radiation source using a radiation detector and producing a random sequence of analog pulses representing said detected radiation;

(b) processing said random sequence of analog pulses by passing said random sequence of analog pulses through a preamplifier and producing a sequence of preamplified analog pulses having a characteristic decay time constant;

(c) processing said sequence of preamplified analog pulses through a high pass filter incorporating a pole-zero cancellation network to produce a sequence of filtered pulses;

(d) digitizing said sequence of filtered pulses to produce a sequence of digitized pulses;

(e) histogramming said sequence of digitized pulses to produce a spectrum characteristic of said radiation source;

(f) selecting at least one peak from said spectrum suitable for determining the accuracy of an adjustment made by said pole-zero adjustment network;

(g) measuring a distortion in said at least one peak to determine a correction calculated to minimize said distortion, said step of measuring a distortion in said at least one peak to determine a correction calculated to minimize said distortion including the steps of:

(1) measuring a centroid of a reference peak from an amplitude histogram obtained at a low count rate, measuring a width of a reference peak from an amplitude histogram obtained at a low count rate;

(2) measuring a centroid of a peak from an amplitude histogram obtained at a high count rate; and (3) measuring a width of a peak from an amplitude histogram obtained at a high count rate and calculating said correction;

wherein when said high count rate peak width approximately equals said reference peak width and said high count rate peak centroid approximately coincides with said reference peak centroid it is determined that said peak shape has a minimum said distortion;

(h) applying said correction to said pole-zero cancellation network; and (i) repeating said step of detecting radiation from a radiation source using a radiation detector and producing a random sequence of analog pulses representing said detected radiation through said step of applying said correction to said pole-zero cancellation network until said distortion is minimized.

25. A method of automatically adjusting of an ionizing radiation spectroscopy system to achieve a peak shape having a minimum distortion, said method comprising the steps of:

(a) detecting radiation from a radiation source using a radiation detector and producing a random sequence of analog pulses representing said detected radiation;

(b) processing said random sequence of analog pulses by passing said random sequence of analog pulses through a preamplifier and producing a sequence of preamplified analog pulses having a characteristic decay time constant;

(c) digitizing said sequence of preamplified analog pulses to produce a sequence of digitized pulses;

(d) processing said sequence of digital pulses through a digital filter to produce a sequence of filtered digital pulses;

(e) histogramming said sequence of filtered digital pulses to produce a spectrum characteristic of said radiation source;

(f) selecting at least one peak from said spectrum suitable for determining the accuracy of an adjustment made by said digital filter;

(g) measuring a distortion in said at least one peak to determine a correction calculated to minimize said distortion, said step of measuring a distortion in said at least one peak to determine a correction calculated to minimize said distortion including the step of:

(1) measuring a width at at least one predetermined fraction of a full height of said at least one peak and calculating said correction;

wherein when each said width at at least one predetermined fraction of a full height is minimized it is determined that said peak shape has a minimum said distortion;

(h) applying said correction to said digital filter; and (i) repeating said step of detecting radiation from a radiation source using a radiation detector and producing a random sequence of analog pulses representing said detected radiation through said step of applying said correction to said digital filter until said distortion is minimized.

26. A method of automatically adjusting of an ionizing radiation spectroscopy system to achieve a peak shape having a minimum distortion, said method comprising the steps of:

(a) detecting radiation from a radiation source using a radiation detector and producing a random sequence of analog pulses representing said detected radiation;

(b) processing said random sequence of analog pulses by passing said random sequence of analog pulses through a preamplifier and producing a sequence of preamplified analog pulses having a characteristic decay time constant;

(c) digitizing said sequence of preamplified analog pulses to produce a sequence of digitized pulses;

(d) processing said sequence of digital pulses through a digital filter to produce a sequence of filtered digital pulses;

(e) histogramming said sequence of filtered digital pulses to produce a spectrum characteristic of said radiation source;

(f) selecting at least one peak from said spectrum suitable for determining the accuracy of an adjustment made by said digital filter;

(g) measuring a distortion in said at least one peak to determine a correction calculated to minimize said distortion, said step of measuring a distortion in said at least one peak to determine a correction calculated to minimize said distortion including the steps of:
  (1) measuring a centroid of a reference peak from an amplitude histogram obtained at a low count rate; and
  (2) measuring a centroid of a peak from an amplitude histogram obtained at a high count rate and calculating said correction;
wherein when said high count rate peak centroid approximately coincides with said reference peak centroid it is determined that said peak shape has a minimum said distortion;
(h) applying said correction to said digital filter; and
(i) repeating said step of detecting radiation from a radiation source using a radiation detector and producing a random sequence of analog pulses representing said detected radiation through said step of applying said correction to said digital filter until said distortion is minimized.

27. A method of automatically adjusting of an ionizing radiation spectroscopy system to achieve a peak shape having a minimum distortion, said method comprising the steps of:
  (a) detecting radiation from a radiation source using a radiation detector and producing a random sequence of analog pulses representing said detected radiation;
  (b) processing said random sequence of analog pulses by passing said random sequence of analog pulses through a preamplifier and producing a sequence of preamplified analog pulses having a characteristic decay time constant;
  (c) digitizing said sequence of pre amplified analog pulses to produce a sequence of digitized pulses;
  (d) processing said sequence of digital pulses through a digital filter to produce a sequence of filtered digital pulses;
  (e) histogramming said sequence of filtered digital pulses to produce a spectrum characteristic of said radiation source;
  (f) selecting at least one peak from said spectrum suitable for determining the accuracy of an adjustment made by said digital filter;
  (g) measuring a distortion in said at least one peak to determine a correction calculated to minimize said distortion, said step of measuring a distortion in said at least one peak to determine a correction calculated to minimize said distortion including the steps of:
    (1) measuring a width of a reference peak from an amplitude histogram obtained at a low count rate; and
    (2) measuring a width of a peak from an amplitude histogram obtained at a high count rate and calculating said correction;
  wherein when said high count rate peak width approximately equals said reference peak width it is determined that said peak shape has a minimum said distortion;
  (h) applying said correction to said digital filter; and
  (i) repeating said step of detecting radiation from a radiation source using a radiation detector and producing a random sequence of analog pulses representing said detected radiation through said step of applying said correction to said digital filter until said distortion is minimized.

28. A method of automatically adjusting of an ionizing radiation spectroscopy system to achieve a peak shape having a minimum distortion, said method comprising the steps of:
  (a) detecting radiation from a radiation source using a radiation detector and producing a random sequence of analog pulses representing said detected radiation;
  (b) processing said random sequence of analog pulses by passing said random sequence of analog pulses through a preamplifier and producing a sequence of preamplified analog pulses having a characteristic decay time constant;
  (c) digitizing said sequence of preamplified analog pulses to produce a sequence of digitized pulses;
  (d) processing said sequence of digital pulses through a digital filter to produce a sequence of filtered digital pulses;
  (e) histogramming said sequence of filtered digital pulses to produce a spectrum characteristic of said radiation source;
  (f) selecting at least one peak from said spectrum suitable for determining the accuracy of an adjustment made by said digital filter;
  (g) measuring a distortion in said at least one peak to determine a correction calculated to minimize said distortion, said step of measuring a distortion in said at least one peak to determine a correction calculated to minimize said distortion including the steps of:
    (1) measuring a centroid of a reference peak from an amplitude histogram obtained at a low count rate;
    (2) measuring a width of a reference peak from an amplitude histogram obtained at a low count rate;
    (3) measuring a centroid of a peak from an amplitude histogram obtained at a high count rate; and
    (4) measuring a width of a peak from an amplitude histogram obtained at a high count rate and calculating said correction
  wherein when said high count rate peak width approximately equals said reference peak width and said high count rate peak centroid approximately coincides with said reference peak centroid it is determined that said peak shape has a minimum said distortion;
  (h) applying said correction to said digital filter; and
  (i) repeating said step of detecting radiation from a radiation source using a radiation detector and producing a random sequence of analog pulses representing said detected radiation through said step of applying said correction to said digital filter until said distortion is minimized.

* * * * *